US008247954B2

(12) United States Patent
Kagayama et al.

(10) Patent No.: US 8,247,954 B2
(45) Date of Patent: Aug. 21, 2012

(54) ELECTRONIC COMPONENT DEVICE AND METHOD FOR MANUFACTURING THE SAME

(75) Inventors: Kenji Kagayama, Nagaokakyo (JP); Toshihiko Unami, Nagaokakyo (JP)

(73) Assignee: Murata Manufacturing Co., Ltd., Nagaokakyo-Shi, Kyoto-fu (JP)

( * ) Notice: Subject to any disclaimer, the term of this patent is extended or adjusted under 35 U.S.C. 154(b) by 0 days.

(21) Appl. No.: 13/034,887

(22) Filed: Feb. 25, 2011

(65) Prior Publication Data

US 2011/0140574 A1 Jun. 16, 2011

Related U.S. Application Data

(63) Continuation of application No. PCT/JP2009/003029, filed on Jun. 30, 2009.

(30) Foreign Application Priority Data

Aug. 27, 2008 (JP) ................................ 2008-218624

(51) Int. Cl.
*H01L 41/08* (2006.01)

(52) U.S. Cl. ......................... 310/351; 310/324; 310/348

(58) Field of Classification Search .................. 310/321, 310/348, 351–353, 324
See application file for complete search history.

(56) References Cited

U.S. PATENT DOCUMENTS 3,796,968 A * 3/1974 Luscher .......................... 331/67
3,984,790 A * 10/1976 Tanaka .......................... 333/200
4,240,002 A * 12/1980 Tosi et al. ..................... 310/324
4,329,613 A * 5/1982 Kinzel et al. .................. 310/344
4,642,510 A * 2/1987 Yamashita ..................... 310/348
4,761,582 A * 8/1988 McKee ......................... 310/322
4,780,062 A * 10/1988 Yamada et al. ............ 417/410.2
5,353,621 A * 10/1994 Knecht et al. ................ 72/379.2
5,446,954 A * 9/1995 Knecht et al. ................ 29/25.35
5,828,157 A * 10/1998 Miki et al. .................... 310/328
6,833,654 B2 * 12/2004 Rubach ......................... 310/344
7,038,356 B2 * 5/2006 Athanas ........................ 310/324
7,750,540 B2 * 7/2010 Sasaki et al. .................. 310/348
7,969,072 B2 * 6/2011 Matsuzawa et al. .......... 310/348

FOREIGN PATENT DOCUMENTS

JP 10-192782 A 7/1998
JP 11-65569 A 3/1999
JP 2000-233157 8/2000
JP 2002-159917 6/2002
JP 2007-013628 1/2007

OTHER PUBLICATIONS

PCT/JP2009/003029 International Search Report dated Sep. 17, 2009.

* cited by examiner

*Primary Examiner* — Mark Budd
(74) *Attorney, Agent, or Firm* — Dickstein Shapiro LLP

(57) ABSTRACT

A vibratory device includes an elastic plate and a piezoelectric diaphragm. The elastic plate includes a fixable portion, a vibratory portion, and a connection portion. The fixable portion is fixed to a fixation member. The vibratory portion is spaced away from a fixable surface of the fixable portion that faces the fixation member and arranged substantially in parallel with the fixable surface. The connection portion connects a first end of the fixable portion in its planar direction and a first end of the vibratory portion in its planar direction. The piezoelectric diaphragm is disposed on a surface of the vibratory portion that is adjacent to the fixable portion. In a direction N normal to the surface of the vibratory portion adjacent to the fixable portion, at least part of the second piezoelectric diaphragm does not overlap the fixable portion.

10 Claims, 9 Drawing Sheets

ELECTRONIC COMPONENT DEVICE AND METHOD FOR MANUFACTURING THE SAME

CROSS REFERENCE TO RELATED APPLICATIONS

The present application is a continuation of International Application No. PCT/JP2009/003029, filed Jun. 30, 2009, which claims priority to Japanese Patent Application No. JP2008-218624, filed Aug. 27, 2008, the entire contents of each of these applications being incorporated herein by reference in their entirety.

FIELD OF THE INVENTION

The present invention relates to a vibratory device and, in particular, a vibratory device including an elastic plate to which a piezoelectric vibrator is attached.

BACKGROUND OF THE INVENTION

Various vibratory devices are proposed as a vibratory device for use in indicating the arrival of an incoming call by vibration. For example, Patent Literature 1 listed below discloses one such example vibratory device. FIG. 23 is a plan view of the vibratory device disclosed in Patent Literature 1. As illustrated in FIG. 23, for a vibratory device 100 disclosed in Patent Literature 1, a ceramic vibrator 105 is attached to an elastic plate 103, and a weight is mounted on a leading end of the elastic plate 103. As illustrated in FIG. 24, the vibratory device 100 includes a support member 102 mounted on a case 101. The base portion of the elastic plate 103 is mounted on the support member 102.

Patent Literature 2 listed below discloses a vibratory device illustrated in FIG. 25. As illustrated in FIG. 25, a vibratory device 110 disclosed in Patent Literature 2 below includes a housing 111. A shim 112 is arranged inside the housing 111, and at least one end of the shim 112 is supported by the housing 111. A piezoelectric element 113 is disposed on at least one surface of the shim 112.

PTL 1: Japanese Unexamined Patent Application Publication No. 10-192782

PTL 2: Japanese Unexamined Patent Application Publication No. 11-65569

The vibratory devices 100 and 110 disclosed in Patent Literature 1 and Patent Literature 2, respectively, do not require a motor. Therefore, a reduction in power consumption, size, and weight can be achieved. However, because the vibratory devices 100 and 110 need a support member and a housing, the problem of an increased parts count is present. In addition, because vibration occurring in each of the vibratory devices 100 and 110 is transmitted through the support member and casing, mechanical losses of vibration occur in the support member and casing and the vibration transmission efficiency is low.

SUMMARY OF THE INVENTION

It is an object of the present invention to provide a vibratory device having a low parts count and achieving high vibration transmission efficiency.

A vibratory device according to the present invention relates to a vibratory device fixed to a fixation member. The vibratory device according to the present invention includes a single elastic plate and a piezoelectric diaphragm. The elastic plate includes a plate-like fixable portion, a plate-like vibratory portion, and a connection portion. The fixable portion is fixed to the fixation member. The vibratory portion is spaced away from a fixable surface of the fixable portion that faces the fixation member and arranged substantially in parallel with the fixable surface. The connection portion connects a first end of the fixation portion in its planar direction and a first end of the vibratory device in its planar direction. The piezoelectric diaphragm is disposed on a surface of the vibratory portion that is adjacent to the fixable portion. In a direction normal to the surface of the vibratory portion adjacent to the fixable portion, at least part of the piezoelectric diaphragm does not overlap the fixable portion.

According to a specific aspect of the present invention, the connection portion may have an approximately U-shaped cross-section. With this, the vibration portion can be vibrated more largely.

According to another specific aspect of the present invention, a length between the first end and a second end of the fixable portion in the planar direction may be shorter than a length between the first end and a second end of the vibratory portion in the planar direction. With this, the maximum amplitude angle of the vibration portion can be larger than that occurring with when the length of the first end and the second end of the fixable portion in its planar direction is the same as or longer than the length between the first end and the second end of the vibration portion in its planar direction.

According to yet another specific aspect of the present invention, the fixable portion may have a cut portion extending from the second end to the first end in the planar direction.

According to still another specific aspect of the present invention, the piezoelectric diaphragm may include a pair of electrodes and a piezoelectric body sandwiched between the pair of electrodes, and the vibratory device may further include a driving circuit for the piezoelectric diaphragm, the driving circuit being electrically coupled to each of the electrodes, the driving circuit being arranged on the fixation member so as to overlap the piezoelectric diaphragm and so as not to overlap the fixable portion in the direction normal to the surface of the vibratory portion adjacent to the fixable portion. With this, the packaging area of the vibratory device can be reduced.

According to still yet another specific aspect of the present invention, the elastic plate may be made of an insulating material, and the vibratory device may further include a metal film formed on the surface adjacent to the fixation member and a side surface of the fixable portion. In this case, when the fixable portion is joined to the fixation member by, for example, solder, the solder adheres to not only the surface of the fixable portion adjacent to the fixation member but also the side surface. Thus, the vibratory device can be firmly fixed to the fixation member.

For the vibratory device according to the present invention, because the piezoelectric diaphragm is disposed on the vibratory portion of the single elastic plate including the fixable portion fixed to the fixation member, the vibratory portion, and the connection portion, its parts count can be reduced, and vibration transmission efficiency can be enhanced. Because in the direction normal to the surface of the vibratory portion adjacent to the fixable portion, at least part of the piezoelectric diaphragm does not overlap the fixable portion, the piezoelectric diaphragm can be readily attached. Accordingly, high productivity can be achieved.

DETAILED DESCRIPTION OF THE INVENTION

The present invention is clarified by description of concrete embodiments of the present invention with reference to the drawings.

First Embodiment

Figure 1:
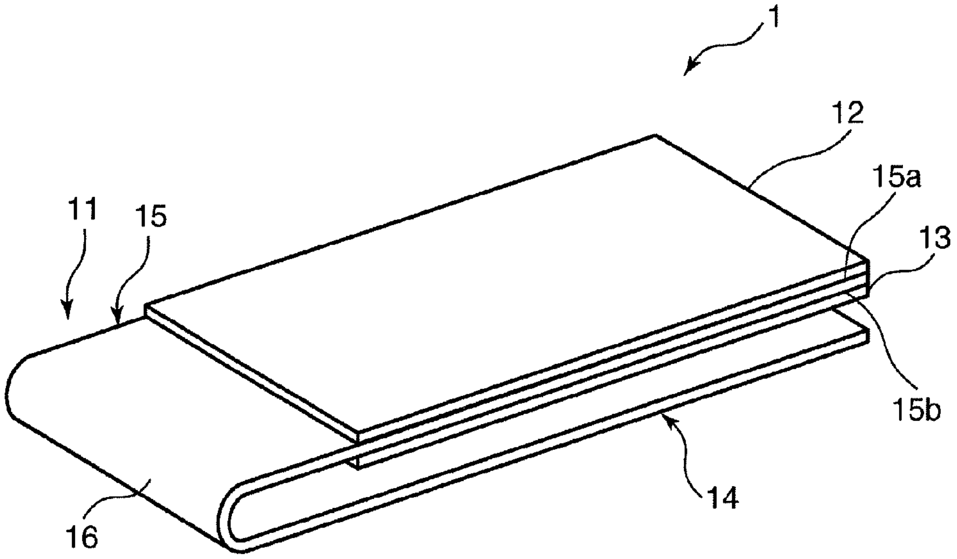
FIG. 1 is a schematic top perspective view of a vibratory device of a first embodiment.
Figure 2:
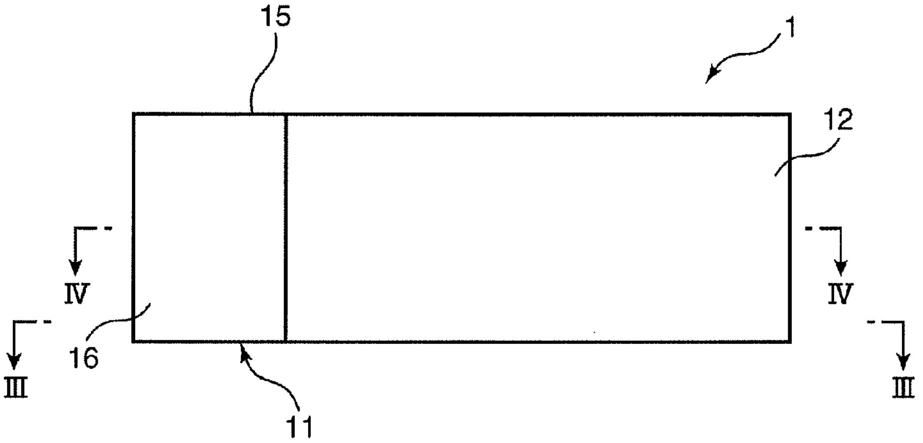
FIG. 2 is a schematic plan view of the vibratory device of the first embodiment.
Figure 3:
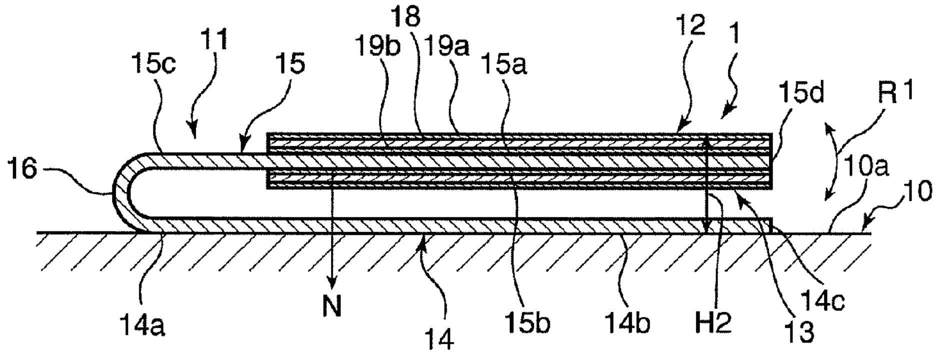
FIG. 3 is a schematic cross-sectional view of the vibratory device along the cut line illustrated in FIG. 2.
Figure 4:
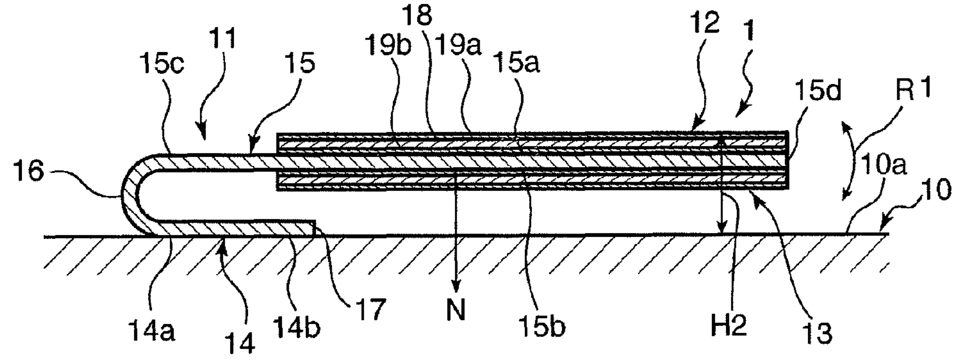
FIG. 4 is a schematic cross-sectional view of the vibratory device along the cut line IV-IV illustrated in FIG. 2.

FIG. 1 is a schematic perspective view of a vibratory device 1 of the present embodiment. FIG. 2 is a schematic plan view of the vibratory device 1. FIG. 3 is a schematic cross-sectional view of the vibratory device 1 along the cut line III-III illustrated in FIG. 2. FIG. 4 is a schematic cross-sectional view of the vibratory device 1 along the cut line IV-IV illustrated in FIG. 2.

As illustrated in FIG. 3, the vibratory device 1 is a device fixed to a fixation member 10 and used for transmitting vibration to the fixation member 10. The fixation member 10 is not particularly limited. The fixation member 10 can be a casing of a cellular phone, for example. That is, the vibratory device 1 can be used in a vibrator of a cellular phone, for example.

As illustrated in FIG. 1, the vibratory device 1 includes an elastic plate 11, a first piezoelectric diaphragm 12, and a second piezoelectric diaphragm 13. The elastic plate 11 includes integrally formed plate-like fixable portion 14, plate-like vibratory portion 15, and connection portion 16. As illustrated in FIG. 3, the connection portion 16 connects a first end 14*a* of the fixable portion 14 in its planar direction and a first end 15*c* of the vibratory portion 15 in its planar direction. The shape of the connection portion 16 is not particularly limited. However, in the terms of largely vibrating the vibratory portion 15, the connection portion 16 may preferably be shaped in the form of a substantially circular arc having a central angle of approximately 180°, that is, be substantially U-shaped, in side view.

The elastic plate 11 is not particularly limited as long as it is elastic. Examples of the material of the elastic plate 11 may include plastic and metal. Among others, metal, such as stainless steel, may be preferable as the material of the elastic plate 11. The elastic plate 11 made of metal can further reduce mechanical losses of vibration in the elastic plate 11.

The thickness of the elastic plate 11 can be set at any value depending on characteristics required for the vibratory device 1 and the material of the elastic plate 11. Generally, the thickness of the elastic plate 11 may preferably be designed such that vibration can be efficiently transmitted by driving of the first and second piezoelectric diaphragms 12 and 13.

A method of producing the elastic plate 11 is also not particularly limited. When the elastic plate 11 is made of a metallic plate, the elastic plate 11 can be produced by bending a flat metallic plate.

As illustrated in FIG. 3, the fixable portion 14 is fixed to the fixation member 10. A method of fixing the fixable portion 14 is not particularly limited. For example, the fixable portion 14 may be attached to the fixation member 10 by the use of solder, an adhesive, or sticky tape, such as acrylic sticky tape. Alternatively, the fixable portion 14 may also be fixed to the fixation member 10 by the use of a screw or rivet.

The vibratory portion 15 is arranged substantially in parallel with a fixable surface 14*b* of the fixable portion 14 that faces the fixation member 10. The vibratory portion 15 is spaced away from the fixable portion 14. The first piezoelectric diaphragm 12 is attached to a first surface 15*a* of the vibratory portion 15. The second piezoelectric diaphragm 13 is attached to a second surface 15*b* of the vibratory portion 15. For the present embodiment, the vibratory portion 15 and the first and second piezoelectric diaphragms 12 and 13 form a bimorph vibrator.

Each of the first and second piezoelectric diaphragms 12 and 13 includes a pair of electrodes 19*a* and 19*b* to which a sinusoidal ac voltage is applied and a piezoelectric body 18, as illustrated in FIG. 3. The piezoelectric body 18 is sandwiched between the pair of electrodes 19*a* and 19*b*.

A method of attaching the first and second piezoelectric diaphragms 12 and 13 is not particularly limited. For example, the first and second piezoelectric diaphragms 12 and 13 may be attached by the use of an adhesive, such as an epoxy adhesive.

The dimensions of each of the vibratory portion 15 and the fixable portion 14 are not particularly limited. Each of the vibratory portion 15 and the fixable portion 14 may have a rectangular shape, or alternatively, it may have a circular or oval shape, for example. The vibratory portion 15 and the fixable portion 14 may have the same shape, or alternatively, they may have different shapes.

Each of the vibratory portion 15 and the fixable portion 14 can be set at any size depending on characteristics required for the vibratory device 1. The vibratory portion 15 and the fixable portion 14 may have the same size, or alternatively, they may have different sizes. Specifically, each of the vibratory portion 15 and the fixable portion 14 may have a rectangular shape with dimensions of 8 mm in width, 20 mm in length, and 0.2 mm in thickness, for example. In this case, each of the first and second piezoelectric diaphragms 12 and 13 can have a rectangular shape with dimensions of 8 mm in width, 16 mm in length, and 0.1 mm in thickness, for example.

Figure 5:
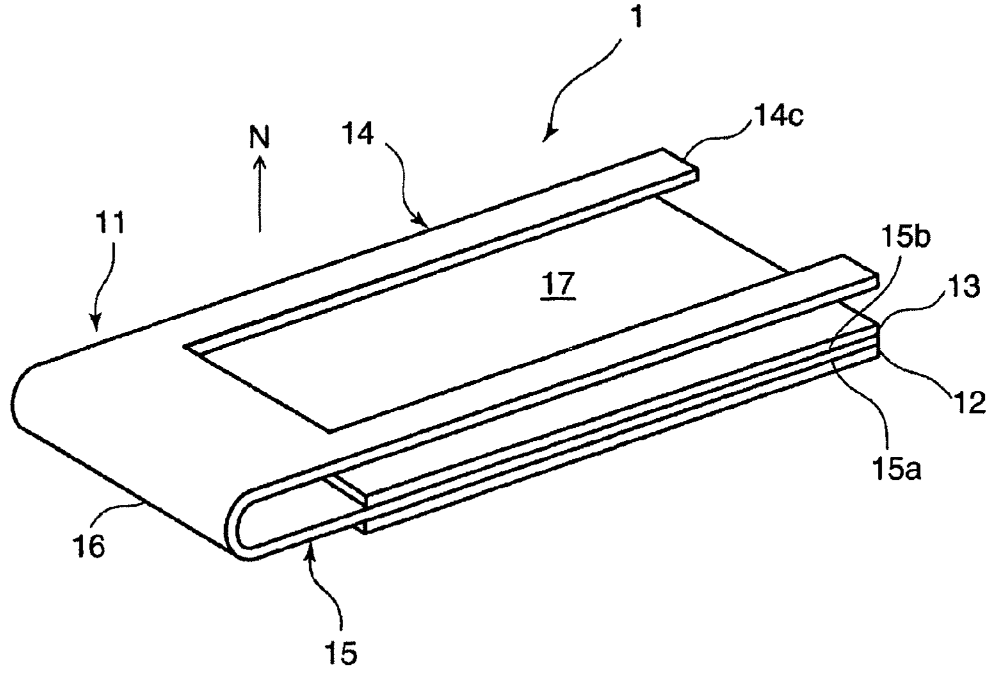
FIG. 5 is a schematic rear perspective view of the vibratory device of the first embodiment.

As illustrated in FIGS. 3 and 5, for the present embodiment, the length between the first end 14*a* of the fixable portion 14 in its planar direction, the end 14*a* being adjacent to the connection portion 16 and a second end 14*c* thereof is substantially the same as the length between the first end 15*c* of the vibratory portion 15 in its direction, the end 15*c* being adjacent to the connection portion 16, and a second end 15*d* thereof. As illustrated in FIG. 5, the fixable portion 14 has a substantially rectangular cut portion 17 extending from the end 14*c* toward the end 14*a*. Therefore, as illustrated in FIGS. 4 and 5, in a normal direction N normal to the second surface 15*b*, which is adjacent to the fixable portion 14, of the vibratory portion 15, at least part of the second piezoelectric diaphragm 13 does not overlap the fixable portion 14. That is, when the vibratory device 1 is seen from the normal direction N, at least part of the second piezoelectric diaphragm 13 is exposed through the fixable portion 14.

The size of the cut portion 17 is not particularly limited. For example, if the fixable portion 14 has a rectangular shape having a size of 8 mm in width, 20 mm in length, and 0.2 mm in thickness, the cut portion 17 can be of a size of approximately 4 mm in width and 15 mm in length.

Figure 25:
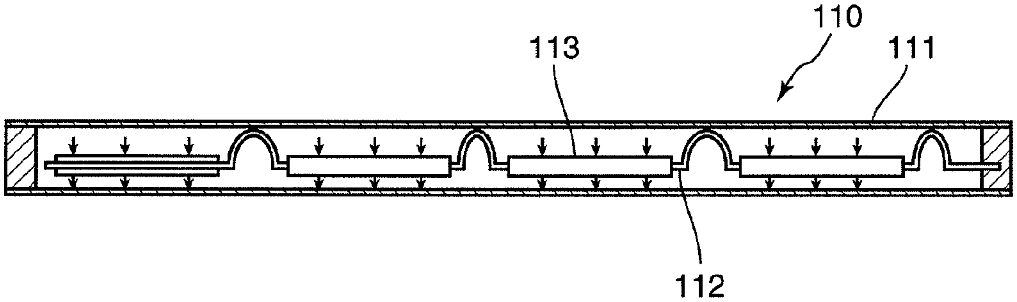
FIG. 25 PRIOR ART
FIG. 25 is a side cross-sectional view of a vibratory device disclosed in Patent Literature 2.

As described above, for the present embodiment, the elastic plate 11 provided with the first and second piezoelectric diaphragms 12 and 13 is directly fixed to the fixation member 10. Unlike the vibratory device 100 illustrated in FIG. 23 and the vibratory device 110 illustrated in FIG. 25, the vibratory device 1 does not need a casing and support member for accommodating and supporting the elastic plate 11. The vibratory device 1 does not have to include a weight, unlike the vibratory device 100. Accordingly, the parts count of the vibratory device 1 can be reduced.

For the present embodiment, because the elastic plate 11 is directly attached to the fixation member 10, mechanical losses of vibration can be reduced, in comparison with when a casing and support member are provided. Accordingly, the fixation member 10 can be efficiently vibrated.

Figure 24:
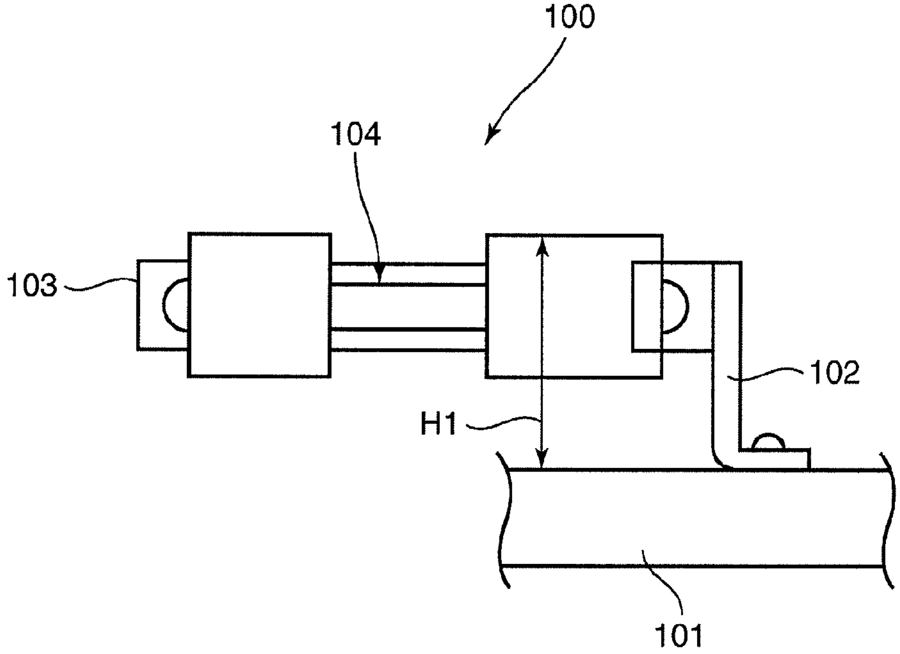
FIG. 24 PRIOR ART
FIG. 24 is a side view of the vibratory device disclosed in Patent Literature 1 when it is attached to a case.

As illustrated in FIG. 24, for example, if the direction of vibration is parallel with the fixable surface of the fixable member, the fixable member cannot be efficiently vibrated. This is because the fixable member is not easily vibrated in a direction parallel to the fixable surface. In contrast to this, for the present embodiment, as illustrated in FIG. 3, the vibratory portion 15 is arranged substantially in parallel with a fixable surface 14*b* of the fixable portion 14. Therefore, the vibration direction R of the vibratory portion 15 is coincident with a direction perpendicular to a fixation surface 10*a* at which the fixation member 10 can be most easily vibrated. Accordingly, the fixation member 10 can be efficiently vibrated.

For the present embodiment, the connection portion 16, which has a substantially circular arc shape in side view, connects the fixable portion 14 and the vibratory portion 15. Therefore, a direction in which the vibratory portion 15 is most easily vibrated is coincident with the vibration direction R1 of the vibratory portion 15. Accordingly, because the vibratory portion 15 is easily vibrated, large vibration can be applied to the fixation member 10.

Figure 23:
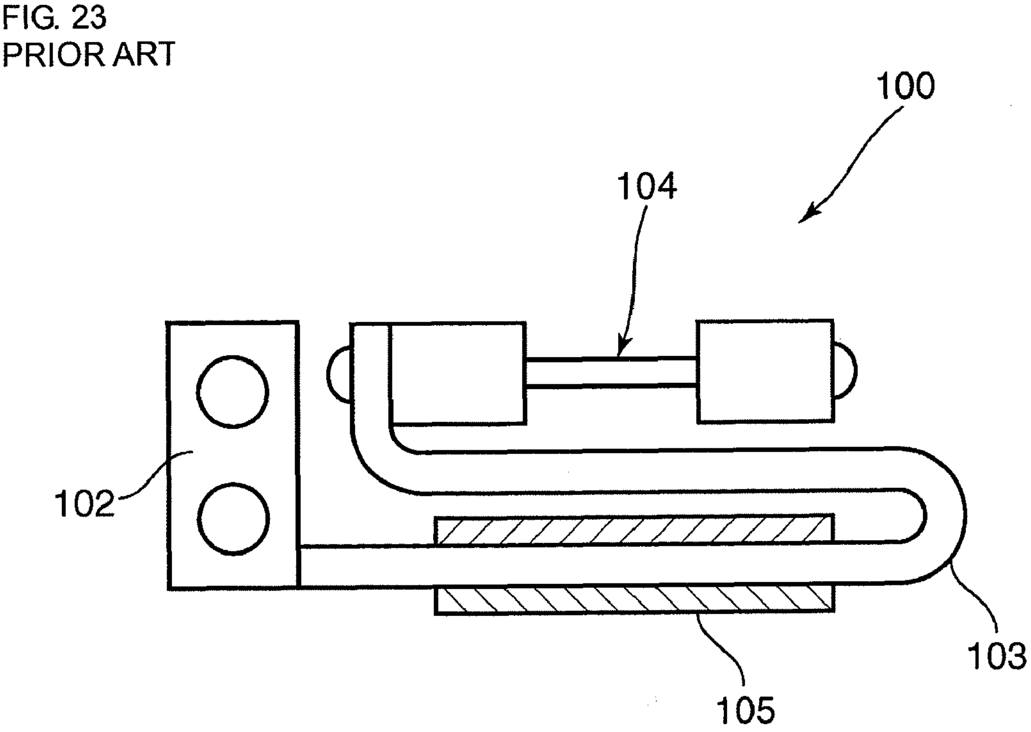
FIG. 23 PRIOR ART
FIG. 23 is a plan view of a vibratory device disclosed in Patent Literature 1.

For the vibratory device 100 illustrated in FIGS. 23 and 24, the elastic plate 103 is perpendicular to the fixation surface, as illustrated in FIG. 24. Therefore, if the width of the elastic plate 103 is increased, the height H1 of the vibratory device 100 in a direction normal to the fixation surface is increased.

In contrast to this, for the present embodiment, as illustrated in FIG. 3, the vibratory portion 15 is arranged substantially in parallel with the fixation surface 10*a*. Therefore, even if the width of the vibratory portion 15 is increased, the height H2 of the vibratory device 1 in the direction normal to the fixation surface 10*a* is not increased. Accordingly, the width of the vibratory portion 15 can be increased without an increase in the height H2 of the vibratory device 1 in the direction normal to the fixation surface 10*a*. Thus, an exciting force occurring in the vibratory device 1 can be increased without an increase in the height H2 of the vibratory device 1 in the direction normal to the fixation surface 10*a*.

For the present embodiment, not only the vibratory portion 15 but also the connection portion 16 contributes to vibration. Therefore, for example, the effective length being the length of a vibratory section of the elastic plate 11, can be longer than that occurring when the plate-like elastic plate is fixed to the fixation member using another support member. Accordingly, with the vibratory device 1, a larger exciting force is obtainable. Conversely, even if the length of the vibratory portion 15 is reduced, a relatively large exciting force is obtainable. Accordingly, the vibratory device 1 can be miniaturized.

Hence, the vibratory device 1 of the present embodiment is advantageous in that it has a low parts count, can produce vibration with high efficiency, and can be miniaturized. However, because the gap between the fixable portion 14 and the vibratory portion 15 is narrow, how the second piezoelectric diaphragm 13 is attached to the second surface 15*b* is an issue.

One possible approach is to have no cut portion 17 in the fixable portion 14 and make all of the second piezoelectric diaphragm 13 overlap the fixable portion 14 in the normal direction N. That is, one possible approach is to cover the entire vibratory portion 15 with the fixable portion 14 when the vibratory device is seen from the normal direction N. With this configuration, the area of the fixable surface 14*b* of the fixable portion 14 can be increased. However, in this case, it is difficult to insert the second piezoelectric diaphragm 13 into the gap between the fixable portion 14 and the vibratory portion 15 and to attach the second piezoelectric diaphragm 13 to the second surface 15*b*.

Figure 6:
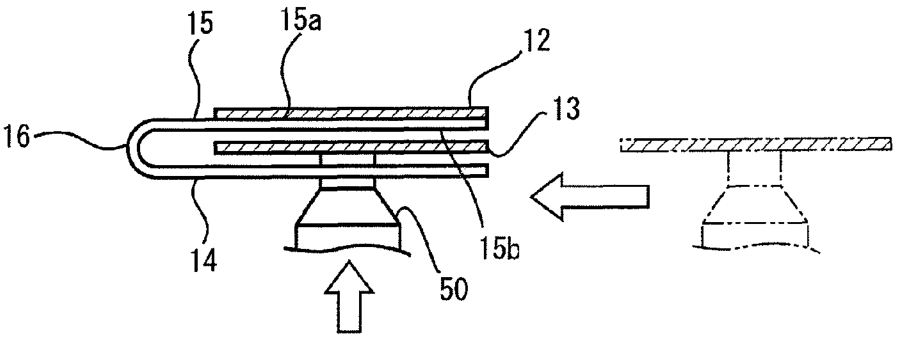
FIG. 6 is a diagram of the vibratory device for describing a step of attaching a second piezoelectric diaphragm.

In contrast to this, for the present embodiment, the fixable portion 14 has the cut portion 17, and in the normal direction N, at least part of the second piezoelectric diaphragm 13 does not overlap the fixable portion 14. Therefore, as illustrated in FIG. 6, the insertion of a mounting nozzle 50 into the cut portion 17 enables the second piezoelectric diaphragm 13 fixed on the mounting nozzle 50 to be arranged below the second surface 15*b*. Accordingly, the use of the mounting nozzle 50 can readily attach the second piezoelectric diaphragm 13. As a result, productivity of the vibratory device 1 can be enhanced, and the cost of the vibratory device 1 can be reduced.

Other examples of preferred embodiments in which the present invention is carried out are described in detail below with reference to FIGS. 7 to 22. In the following description, members having substantially common functions to those in the first embodiment are referred to using common reference numbers, and description thereof is not repeated.

Second Embodiment

For the above first embodiment, an example in which the cut portion 17 of the fixable portion 14 forms a section that does not overlap the fixable portion 14 in the second piezoelectric diaphragm 13 in the normal direction N is described. However, the present invention is not limited to this configuration.

Figure 7:
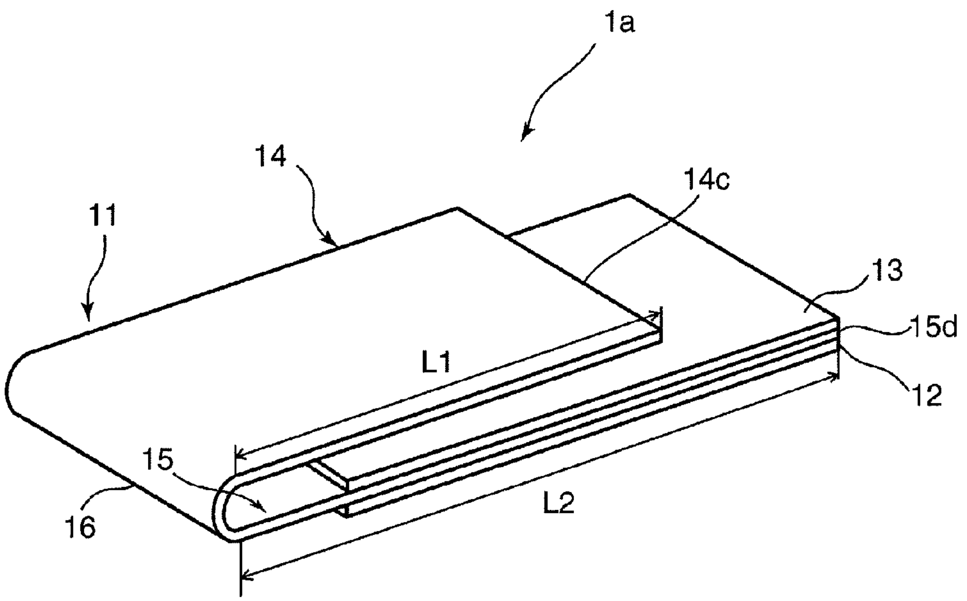
FIG. 7 is a schematic perspective view of a vibratory device according to a second embodiment.

For example, as illustrated in FIG. 7, the second piezoelectric diaphragm 13 may include a section that does not overlap the fixable portion 14 in the normal direction N by making the length L1 between the first end of the fixable portion 14 in its planar direction, the end being adjacent to the connection portion 16, and the second end 14*c* shorter than the length L2 between the first end of the vibratory portion 15 in its planar direction, the end being adjacent to the connection portion 16, and the second end 15*d*. Even in this case, the mounting nozzle 50 can be positioned in the normal direction N of the vibratory portion 15. Thus, the second piezoelectric diaphragm 13 fixed on the mounting nozzle 50 can be arranged below the second surface 15*b*. Accordingly, the use of the mounting nozzle 50 enables readily attaching the second piezoelectric diaphragm 13. As a result, productivity of a vibratory device 1*a* can be enhanced, and the cost of the vibratory device 1*a* can be reduced.

Figure 9:
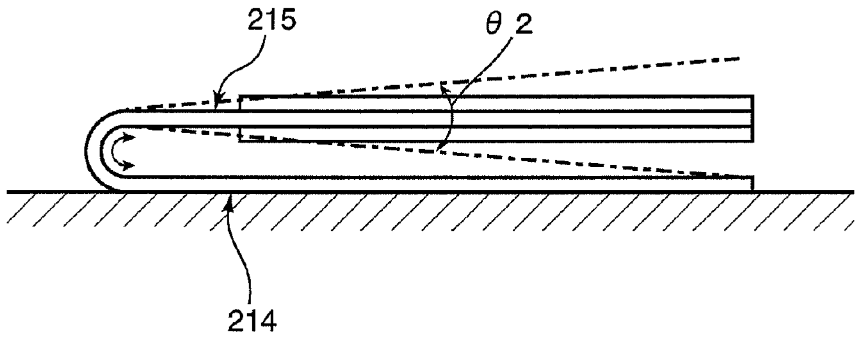
FIG. 9 is a simplified side view of a vibratory device according to a comparative example.

Making the length L1 of the fixable portion 14 shorter than the length L2 of the vibratory portion 15 enables largely vibrating the vibratory portion 15. For example, as illustrated in FIG. 9, if the length of a fixable portion 214 and the length of a vibratory portion 215 are the same, large vibration of the vibratory portion 215 causes contact with the second piezoelectric diaphragm 13. Thus, in order to have a large maximum amplitude angle θ2, it is necessary to have a large distance between the vibratory portion 215 and the fixable portion 214. Accordingly, it is difficult to achieve both miniaturizing the vibratory device and having the large maximum amplitude angle θ2.

Figure 8:
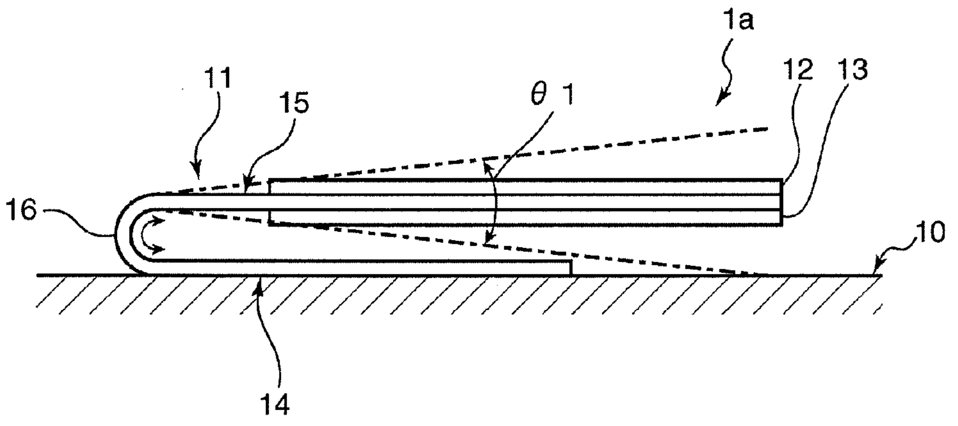
FIG. 8 is a simplified side view of the vibratory device according to the second embodiment.

In contrast to this, for the present embodiment, in which the length L1 of the fixable portion 14 is shorter than the length L2 of the vibratory portion 15, as illustrated in FIG. 8, the occurrence of contact between the vibrating vibratory portion 15 and the fixable portion 14 is reduced. Accordingly, as in the present embodiment, making the length L1 of the fixable portion 14 shorter than the length L2 of the vibratory portion 15 enables a large amplitude angle θ1 without increasing the distance between the vibratory portion 15 and the fixable portion 14. Thus, both miniaturizing the vibratory device 1*a* and having the large maximum amplitude angle θ1 can be achieved.

(First to Fourth Variations)

For the above first embodiment, as illustrated in FIG. 5, an example in which the rectangular cut portion 17 is formed is described. However, for the present invention, the shape of the cut portion 17 is not particularly limited as long as it allows insertion of the mounting nozzle 50 illustrated in FIG. 6.

Figure 10:
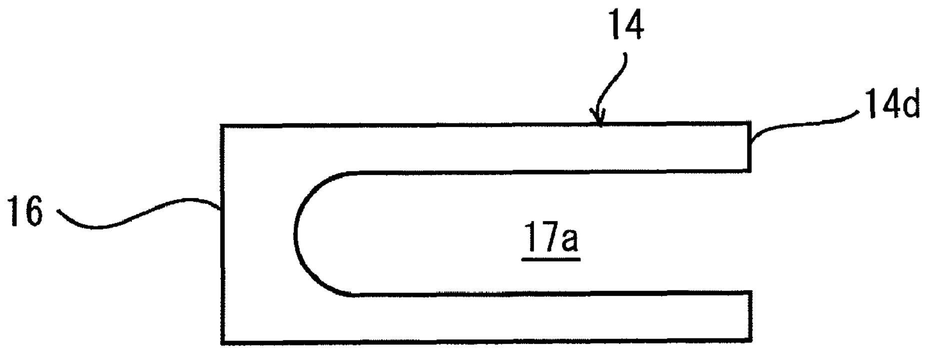
FIG. 10 is a rear view of a vibratory device according to a first variation.

For example, as illustrated in FIG. 10, the fixable portion 14 may have an elongated semicircular cut portion 17*a* extending from an end 14*d* toward the connection portion 16.

Figure 11:
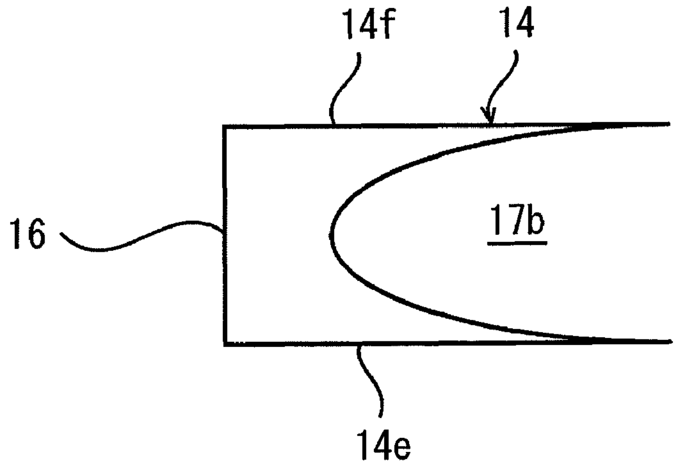
FIG. 11 is a rear view of a vibratory device according to a second variation.

As illustrated in FIG. 11, the fixable portion 14 may have a semi-elliptic cut portion 17*b* extending toward the connection portion 16. In this case, the cut portion 17*b* may reach lateral ends 14*e* and 14*f*. With this, the length of the fixable portion 14 can be shorter than the length of the vibratory portion 15. Therefore, as in the vibratory device of the second embodiment, the maximum amplitude angle can be increased.

Figure 12:
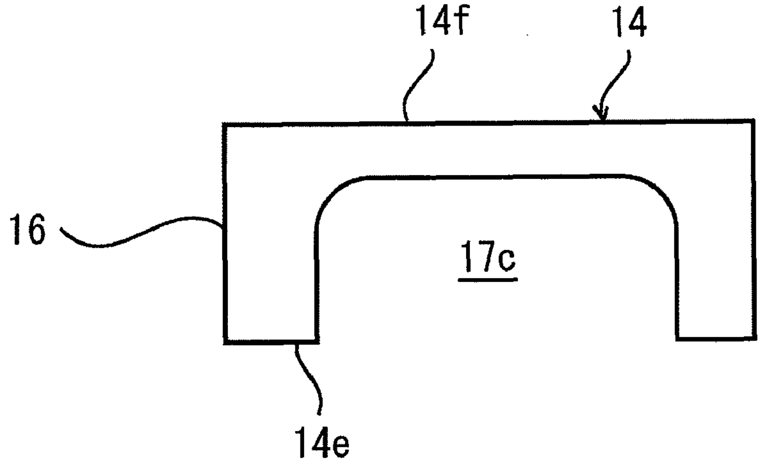
FIG. 12 is a rear view of a vibratory device according to a third variation.

As illustrated in FIG. 12, the fixable portion 14 may have a cut portion 17*c* extending from a first lateral end 14*e* toward a second lateral end 14*f*. Also in this case, the shape of the cut portion 17*c* is not particularly limited. Examples of the shape of the cut portion 17*c* may include a rectangular shape having a rounded top, a rectangular shape, a semicircular shape, an elongated semicircular shape, and a semi-elliptical shape.

Figure 13:
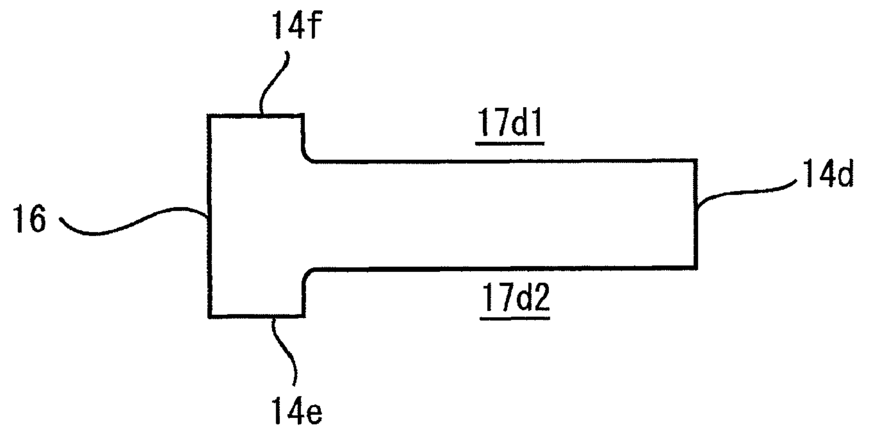
FIG. 13 is a rear view of a vibratory device according to a fourth variation.

As illustrated in FIG. 13, the fixable portion 14 may have cut portions 17*d*1 and 17*d*2 reaching the lateral ends 14*e* and 14*f* of the fixable portion 14, respectively. Also in this case, the shape of each of the cut portions 17*d*1 and 17*d*2 is not particularly limited. Examples of the shape of each of the cut portions 17*d*1 and 17*d*2 may include a rectangular shape having a rounded top, a rectangular shape, a semicircular shape, an elongated semicircular shape, and a semi-elliptical shape.

Third Embodiment

Figure 14:
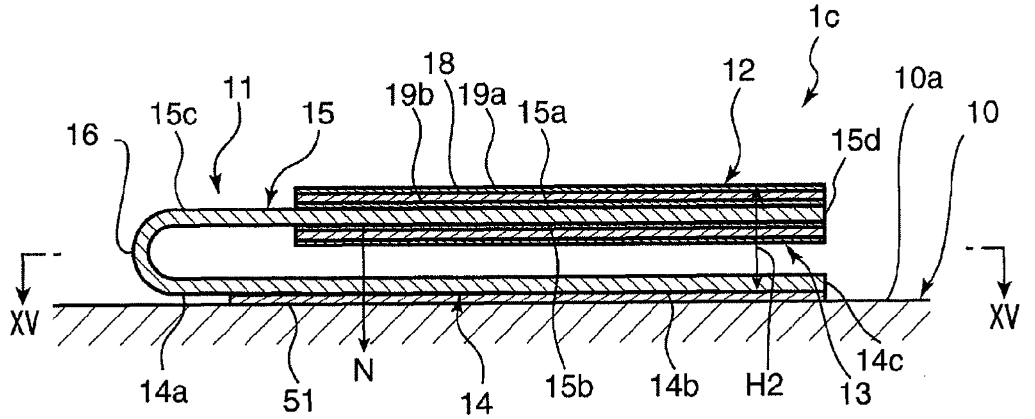
FIG. 14 is a schematic cross-sectional view of a vibratory device of a third embodiment.
Figure 15:
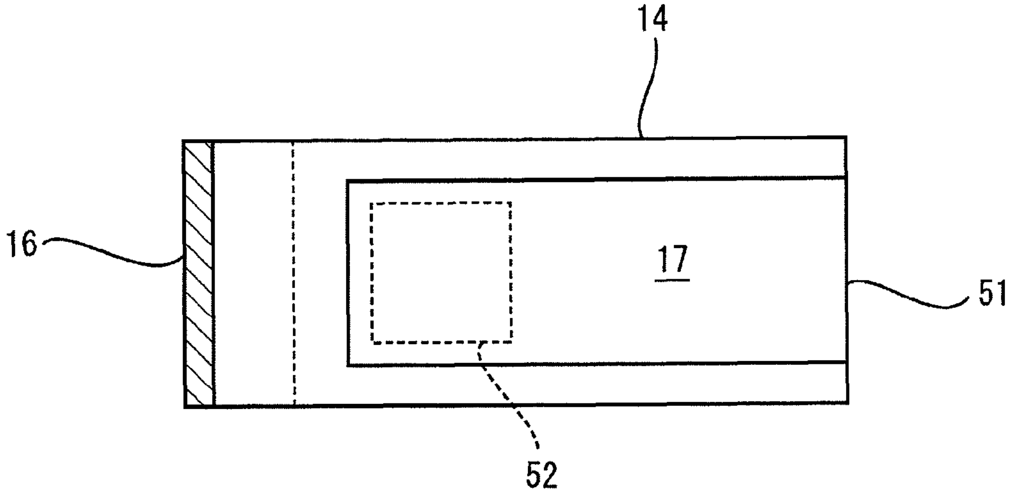
FIG. 15 is a schematic cross-sectional view of the vibratory device along the cut line XV-XV illustrated in FIG. 14.

FIG. 14 is a schematic cross-sectional view of a vibratory device 1*c* of a third embodiment. FIG. 15 is an illustration taken along the line XV-XV in FIG. 14. As illustrated in FIG. 15, for the present embodiment, the fixable portion 14 is fixed to the fixation surface 10*a* of the fixation member 10 such that a flexible printed board 51 attached to the fixable surface 14*b* is disposed therebetween. As illustrated in FIG. 15, the flexible printed board 51 is provided with a driving circuit 52 for the first and second piezoelectric diaphragms 12 and 13, the driving circuit 52 being electrically coupled to the electrodes 19*a* and 19*b*. The driving circuit 52 is positioned within the cut portion 17. The driving circuit 52 is fixed on the fixation member 10 so as to overlap the second piezoelectric diaphragm 13 and so as not to overlap the fixable portion 14 in the normal direction N.

In this way, arranging the driving circuit 52 so as to overlap the second piezoelectric diaphragm 13 and so as not to overlap the fixable portion 14 in the normal direction N can achieve a reduced packaging area of the vibratory device 1*c* seen from the normal direction N, in comparison with when the driving circuit 52 is arranged so as not to overlap the second piezoelectric diaphragm 13 in the normal direction N.

The driving circuit 52 may be an automatic excitation circuit for the first and second piezoelectric diaphragms 12 and 13, or alternatively, it may be a power-supply circuit for use in turning on and off.

Fourth Embodiment

Figure 16:
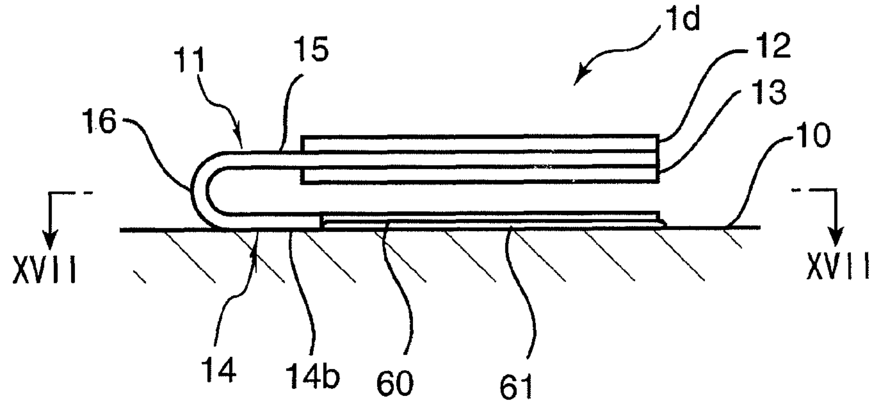
FIG. 16 is a schematic cross-sectional view of a vibratory device of a fourth embodiment.
Figure 17:
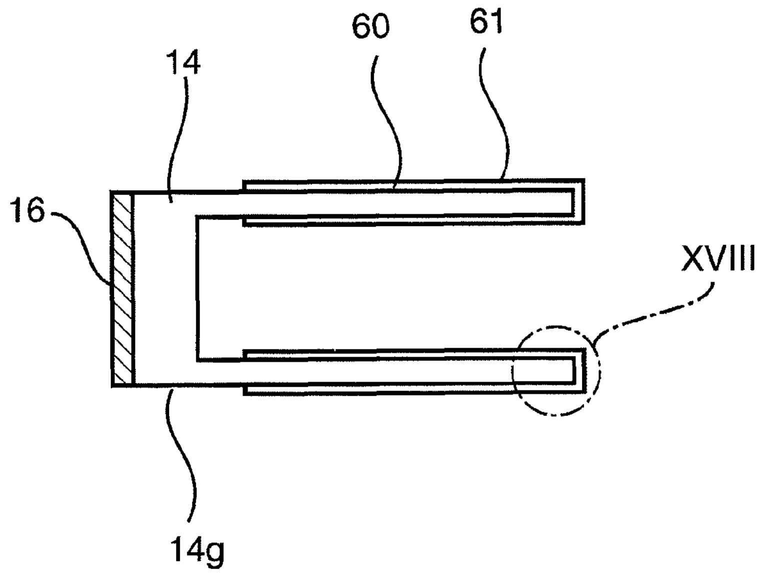
FIG. 17 is a schematic cross-sectional view of the vibratory device along the cut line XVII-XVII illustrated in FIG. 16.
Figure 18:
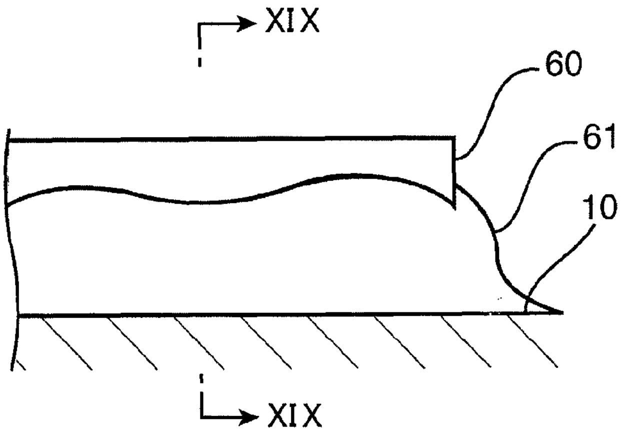
FIG. 18 is an enlarged side view of the section XVIII illustrated in FIG. 17.
Figure 19:
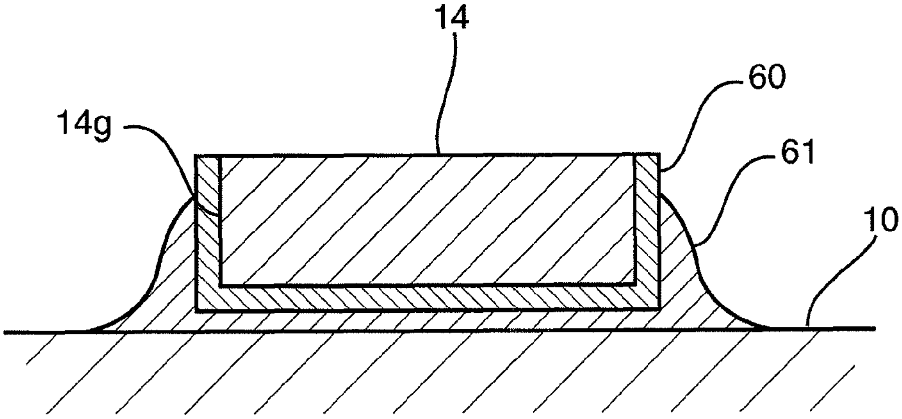
FIG. 19 is a schematic cross-sectional view of the vibratory device along the cut line XIX-XIX illustrated in FIG. 18.

FIG. 16 is a side view of a vibratory device 1*d* of a fourth embodiment. FIG. 17 is an illustration taken along the line XVII-XVII in FIG. 16. FIG. 18 is an enlarged side view of the section XVIII illustrated in FIG. 17. FIG. 19 is an illustration taken along the line XIX-XIX in FIG. 18. For the vibratory device 1*d* of the present embodiment, the elastic plate 11 is made of an insulating material. As illustrated in FIG. 16, a metal film 60 is formed on the surface of the fixable portion 14. The metal film 60 is formed so as to cover the fixable surface 14*b* and a side surface 14*g* of the fixable portion 14. For the present embodiment, the metal film 60 and the fixation member 10 are fixed by the use of solder 61.

In this way, forming the metal film 60 on not only the fixable surface 14*b* but also the side surface 14*g* causes the solder 61 to adhere to the metal film 60 on the side surface 14*g*. Accordingly, the area of attachment by the use of the solder 61 can be increased. As a result, the vibratory device 1 can be firmly fixed to the fixation member 10.

The metal film 60 may function as an electrode. For example, the metal film 60 may be an extraction electrode connected to the electrodes 19*a* and 19*b*.

(Fifth Variation)

Figure 20:
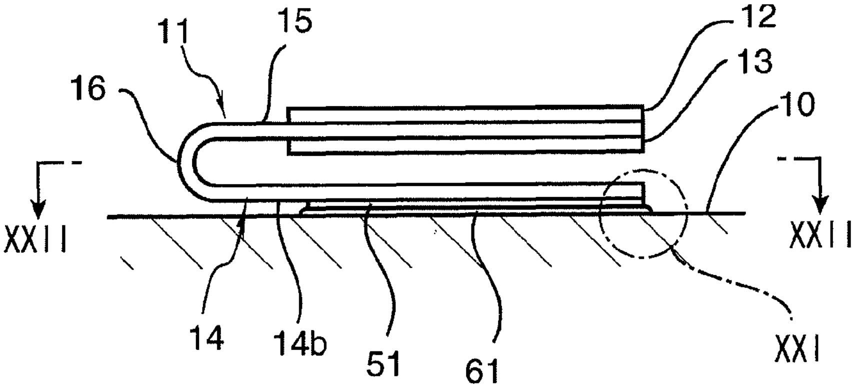
FIG. 20 is a schematic cross-sectional view of a vibratory device of a fifth variation.
Figure 21:
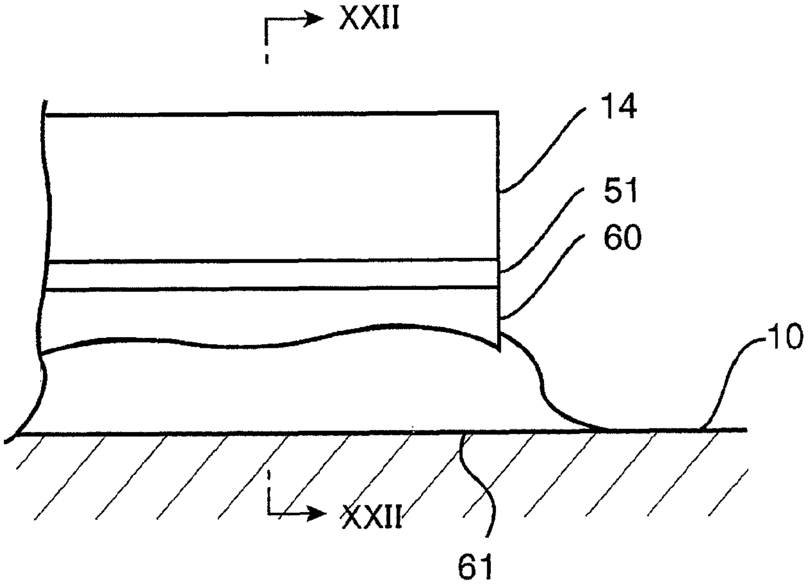
FIG. 21 is an enlarged schematic side view of a fixable portion.
Figure 22:
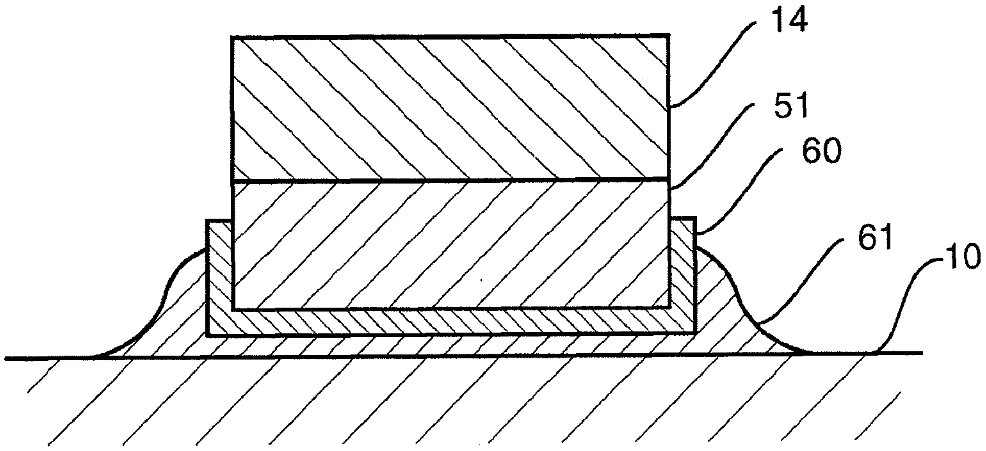
FIG. 22 is a schematic cross-sectional view of the vibratory device along the cut line XXI-XXI illustrated in FIG. 21.

For the above fourth embodiment, an example in which the metal film 60 is disposed on the fixable surface 14*b* and the side surface 14*g* of the fixable portion 14 is described. However, the present invention is not limited to this configuration. For example, as illustrated in FIGS. 20 to 22, the fixable portion 14 may be fixed to the fixation member 10 such that the flexible printed board 51 is disposed therebetween, and the metal film 60 may be formed on the bottom surface and side surface of the flexible printed board 51. Even in this case, as in the above fourth embodiment, the vibratory device 1 can be firmly to the fixation member 10.

(Other Variations)

For the above embodiments, examples in which the first and second piezoelectric diaphragms 12 and 13 are provided to the first and second surfaces 15*a* and 15*b* of the vibratory portion 15 are described. However, a piezoelectric diaphragm may be provided to only the second surface 15*b*. That is, the vibratory device of the present invention may be a unimorph vibratory device.

REFERENCE NUMBERS

1 vibratory device
10 fixation member
10*a* fixation surface
11 elastic plate
12 first piezoelectric diaphragm
13 second piezoelectric diaphragm
14 fixable portion
14*a* first end in the planar direction and adjacent to fixable portion
14*b* fixable surface
14*c* second end in the planar direction and opposite to the end 14*a*
14*e* lateral end
14*f* lateral end
14*g* side surface
15 vibratory portion
15*a* first surface
15*b* second surface
15*c* first end in the planar direction and adjacent to fixable portion
15*d* second end in the planar direction and opposite to the end 15*c*
16 connection portion
17 cut portion
18 piezoelectric body
19*a*, 19*b* electrodes
50 mounting nozzle
51 flexible printed board
52 driving circuit
60 metal film
61 solder

The invention claimed is:

1. A vibratory device comprising:

an elastic plate including a plate-like fixable portion, a plate-like vibratory portion spaced away from the fixable portion, and a connection portion connecting a first end of the fixable portion to a first end of the vibratory portion; and a piezoelectric diaphragm disposed on a surface of the vibratory portion that is adjacent to the fixable portion, wherein, in a direction normal to the surface of the vibratory portion adjacent to the fixable portion, at least part of the piezoelectric diaphragm does not overlap the fixable portion, and wherein the fixable portion has a cut portion extending from a second end toward the first end thereof.

2. The vibratory device according to claim 1, wherein the connection portion has an approximately U-shaped cross-section.

3. The vibratory device according to claim 1, wherein the vibratory portion is arranged substantially parallel to the fixable portion.

4. The vibratory device according to claim 1, wherein a length of the fixable portion is shorter than a length of the vibratory portion.

5. The vibratory device according to claim 1, wherein the cut portion has one of a rectangular shape, a semicircular shape, an elongated semicircular shape, and a semi-elliptical shape.

6. A vibratory device comprising:

an elastic plate including a plate-like fixable portion, a plate-like vibratory portion spaced away from the fixable portion, and a connection portion connecting a first end of the fixable portion to a first end of the vibratory portion; and a piezoelectric diaphragm disposed on a surface of the vibratory portion that is adjacent to the fixable portion, wherein, in a direction normal to the surface of the vibratory portion adjacent to the fixable portion, at least part of the piezoelectric diaphragm does not overlap the fixable portion, and wherein the fixable portion has a cut portion extending from a first lateral side toward a second lateral side thereof.

7. The vibratory device according to claim 1, wherein the piezoelectric diaphragm includes a pair of electrodes and a piezoelectric body sandwiched between the pair of electrodes.

8. The vibratory device according to claim 7, wherein the vibratory device further comprises a driving circuit for the piezoelectric diaphragm, the driving circuit being electrically coupled to each of the electrodes, the driving circuit being arranged so as to overlap the piezoelectric diaphragm and so as not to overlap the fixable portion in the direction normal to the surface of the vibratory portion adjacent to the fixable portion.

9. The vibratory device according to claim 1, wherein the elastic plate is an insulating material, and the vibratory device further comprises a metal film on at least one surface of the fixable portion.

10. The vibratory device according to claim 9, wherein the vibratory device further comprises a driving circuit for the piezoelectric diaphragm, the driving circuit being arranged so as to overlap the piezoelectric diaphragm and the metal film on the fixable portion in the direction normal to the surface of the vibratory portion adjacent to the fixable portion.

* * * * *